(12) United States Patent
Iwase et al.

(10) Patent No.: US 8,797,484 B2
(45) Date of Patent: Aug. 5, 2014

(54) DISPLAY APPARATUS

(75) Inventors: Yuichi Iwase, Kanagawa (JP); Yasunori Kijima, Tokyo (JP); Toshimasa Sakayori, Tokyo (JP); Kenichi Horie, Tokyo (JP); Takashi Sugio, Tokyo (JP); Takehito Miura, Kanagawa (JP)

(73) Assignee: Sony Corporation, Tokyo (JP)

( * ) Notice: Subject to any disclaimer, the term of this patent is extended or adjusted under 35 U.S.C. 154(b) by 1396 days.

(21) Appl. No.: 10/466,901

(22) PCT Filed: Jan. 24, 2002

(86) PCT No.: PCT/JP02/00501
§ 371 (c)(1),
(2), (4) Date: Dec. 29, 2003

(87) PCT Pub. No.: WO02/059861
PCT Pub. Date: Aug. 1, 2002

(65) Prior Publication Data
US 2004/0100601 A1 May 27, 2004

(30) Foreign Application Priority Data
Jan. 24, 2001 (JP) .................................. 2001-015425

(51) Int. Cl.
*G02F 1/1337* (2006.01)
(52) U.S. Cl.
USPC ........................................................ 349/122
(58) Field of Classification Search
USPC .......... 349/122, 153, 190; 313/503–506, 509, 313/512
See application file for complete search history.

(56) References Cited

U.S. PATENT DOCUMENTS

| 4,428,793 | A |   | 1/1984  | Sato et al.            |
|-----------|---|---|---------|------------------------|
| 4,853,079 | A |   | 8/1989  | Simopoulos et al.      |
| 5,194,027 | A |   | 3/1993  | Kruskopf et al.        |
| 5,854,664 | A | * | 12/1998 | Inoue et al. ..... 349/92 |
| 5,990,615 | A | * | 11/1999 | Sakaguchi et al. ..... 313/504 |
| 6,091,196 | A | * | 7/2000  | Codama ..... 313/504   |

(Continued)

FOREIGN PATENT DOCUMENTS

| EP | 0 712 722 A1   | 5/1996 |
|----|----------------|--------|
| JP | 04-212287 A1   | 8/1992 |

(Continued)

OTHER PUBLICATIONS

Supplementary European Search Report issued Jul. 7, 2009 for corresponding European Application 02 71 6357.

*Primary Examiner* — Timothy L Rude
(74) *Attorney, Agent, or Firm* — Rader, Fishman & Grauer PLLC

(57) ABSTRACT

A display apparatus, in which the entrapment of air bubbles on the inside of the sealing is suppressed, is provided. In a display apparatus including an element member (L) having an adhesion surface on which a display area (1a) is provided, and a sealing member (U) having an adhesion and which is adhered with a resin layer (m) between this adhesion surface and the adhesion surface of the element member (L), it is one in which the resin layer (m) is formed by combining a resin material (M), which is dispersed and applied in a plurality of places on an adhesion surface of at least one of the element member (L) and the sealing member (U), by pressing the element member (L) and the sealing member (U) against each other with the resin material (M) in between.

23 Claims, 13 Drawing Sheets

(56) References Cited

U.S. PATENT DOCUMENTS

| | | | |
|---|---|---|---|
| 6,111,357 A * | 8/2000 | Fleming et al. | 313/509 |
| 6,226,067 B1 * | 5/2001 | Nishiguchi et al. | 349/155 |
| 6,259,204 B1 * | 7/2001 | Ebisawa et al. | 313/512 |
| 6,382,693 B1 | 5/2002 | Ljungmann | |
| 6,392,736 B1 * | 5/2002 | Furukawa et al. | 349/158 |
| 6,650,393 B1 * | 11/2003 | Nishiguchi | 349/156 |

FOREIGN PATENT DOCUMENTS

| | | |
|---|---|---|
| JP | 08-124677 A1 | 5/1996 |
| JP | 08-220658 A | 8/1996 |
| JP | 08-220658 A1 | 8/1996 |
| JP | 11-283739 A1 | 10/1999 |
| JP | 11-327448 A1 | 11/1999 |
| JP | 2001-1345175 * | 12/2001 |

* cited by examiner

DISPLAY APPARATUS

TECHNICAL FIELD

The present invention relates to a display apparatus, and relates in particular to a display apparatus in which a display area is sealed between members that are adhered together with a resin layer in between.

BACKGROUND ART

In recent years, the importance of interfaces between people and machines including multimedia-oriented products has started to grow. In order for people to operate machines more comfortably and efficiently, it is necessary to draw information from the machine to be operated without error, briefly, instantaneously, and in sufficient amounts, and various display apparatuses as interfaces to that end are being studied.

Currently, liquid crystal display apparatuses are used in many of the manufactured goods we use daily, such as compact TV sets, clocks, electronic calculators, not to mention laptop-type information processing devices. These liquid crystal display apparatuses are configured such that the peripheral portions of two sheets of members, on which electrodes are formed, are adhered together and sealed with a resin material in between, and liquid crystal is filled between the electrodes of these members. The liquid crystal display apparatus displays by changing the alignment of liquid crystal molecules by applying a voltage from the electrodes and controlling the transmission of light in the liquid crystal layer.

Further, in addition to such liquid crystal display apparatuses, self emissive type display apparatuses, such as plasma display apparatuses, inorganic electroluminescent display apparatuses, and organic electroluminescent display apparatuses, in which light emitting elements are provided in a display area, are being studied. Of the light emitting elements used in such display apparatuses, FIG. 22 illustrates a configuration example of an organic electroluminescence (hereinafter referred to as EL) element used in organic electroluminescent display apparatuses.

The light emitting element shown in this drawing (the organic EL element) is provided on a sheet of base material 1 made of, for example, glass or the like. A light emitting element 2 on the base material 1 is configured, for example, with a lower electrode 3 provided as an anode electrode, a hole transport layer 4, a light emitting layer 5 and an electron transport layer 6, which are sequentially layered on this lower electrode 3, and an upper electrode 7, which forms a cathode electrode, provided thereabove. In the light emitting element 2 that is configured in such a manner, the emission light, which is generated when electrons injected from the lower electrode 3 and the upper electrode 7 and holes recombine in the light emitting layer 5, is drawn from the side of the base material 1 or the side of the upper electrode 7.

By the way, in order to apply organic EL elements to a color display, stable emission of the three primary colors RGB is a vital condition. However, in organic EL elements, a non-light emitting spot referred to as a dark spot occurs as a result of extended periods of driving. The growth of this dark spot is one of the causes that shorten the life of organic EL elements.

It is known that a dark spot generally occurs in a size invisible to the naked eye just after driving, and with that as the nucleus grows through continuous driving. In addition, it is known that a dark spot occurs even under storage conditions where no driving is performed, and grows with time.

Various causes of dark spots are conceivable, but as external causes, crystallization of the organic layer due to moisture and oxygen entering inside the device, the detachment of a cathode metal electrode or the like are conceivable. As internal causes, shorting due to crystal growth of the cathode metal, crystallization and deterioration of the organic layer due to heat generation accompanying the emission of light or the like are considered as causes of dark spots.

Therefore, as shown in FIG. 23, a display apparatus employing the light emitting element (organic EL element) 2 of such a configuration seals a display area 1a (light emitting element 2) inside a resin layer m formed with a resin material M by filling the resin material M between an element member L, which is configured by providing the light emitting element 2 on a display area 1a of the sheet of base material 1, and a sealing member U that is disposed on the side of the display area 1a of this element member L.

In manufacturing the display apparatus of such a configuration, first, the light emitting element 2 is formed in the display area 1a of the base material 1 to form the element member L. Subsequently, the resin material M that is not cured is applied and provided on the element member L so as to cover the entire display area 1a to form the resin layer m. Next, the sealing member U, which is held substantially horizontally, is mounted on the resin layer m and is pressed thereagainst. Thus, the sealing member U is adhered to the resin layer m, and after that, this resin layer m is cured.

However, when adhering the element member L and the sealing member U with the resin layer m in between, because the display apparatus with the configuration shown in FIG. 23 is in a state in which the sealing member U face-contacts the resin layer m, air bubbles p are prone to becoming trapped between the display area 1a and the sealing member U. Accordingly, although the light emitting element 2 is sealed in the resin layer m, the degradation of the light emitting element 2 due to the moisture and the oxygen in the atmosphere that is trapped within these air bubbles p cannot be prevented. And particularly, when the display apparatus is of a so-called top emitting type, in which light is drawn from the side of the sealing member U, such portions of the air bubbles p directly become non-light emitting portions, and the display apparatus becomes a defective good in which good display characteristics cannot be obtained.

In addition, in order to adhere the element member L and the sealing member U together, as described above, it is necessary that the operation be performed with care such that the air bubbles p do not become trapped. Thus, as a result in part, this adhesion process is a factor that decreases the productivity for the display apparatus.

Therefore, the present invention makes it its object to provide a display apparatus capable of sealing light emitting elements between two sheets of members without trapping air bubbles, and further, with ease.

DISCLOSURE OF THE INVENTION

The present invention for solving such an objective is characterized in that, in a display apparatus including an element member having an adhesion surface on which a display area is provided and a sealing member having an adhesion surface and whose adhesion surface is adhered with the adhesion surface of the element member with a resin layer in between, the resin layer is formed by combining resin materials dispersed and applied in a plurality of places on at least one of the adhesion surfaces of the element member and the sealing member by pressing both the element member and the sealing member against each other with the resin materials in between.

In such a display apparatus, the adhesion of the element member with the sealing member is performed while draining air from between the resin materials that are distributed and applied in a plurality of places. Accordingly, this display apparatus becomes one in which the element member and the sealing member are adhered together with the resin layer in between, which is formed such that the resin materials are combined without leaving air bubbles behind.

In this case, the resin layer is formed by, for example, combining the resin material applied in the form of a plurality of lines having predetermined intervals by pressing the element member and the sealing member against each other. Further, the resin layer is formed by sequentially combining the resin material while ridding air through the paths between the resin material by shifting the pressure position of the element member and the sealing member along the direction in which the resin material, which are applied in a plurality of lines, extend.

As an example of such a display apparatus, a display apparatus, in which light emitting elements are provided in the display area, and the resin layer is provided in such a state as to cover the display area, may be given. In this case, the present invention is particularly effective for a configuration in which the sealing member includes a light transmissive material, and the emission light of the light emitting element is drawn from the side of the sealing member

BEST MODE FOR CARRYING OUT THE INVENTION

Below, embodiments of a display apparatus of the present invention will be described in detail based on the drawings.

Figure 22:
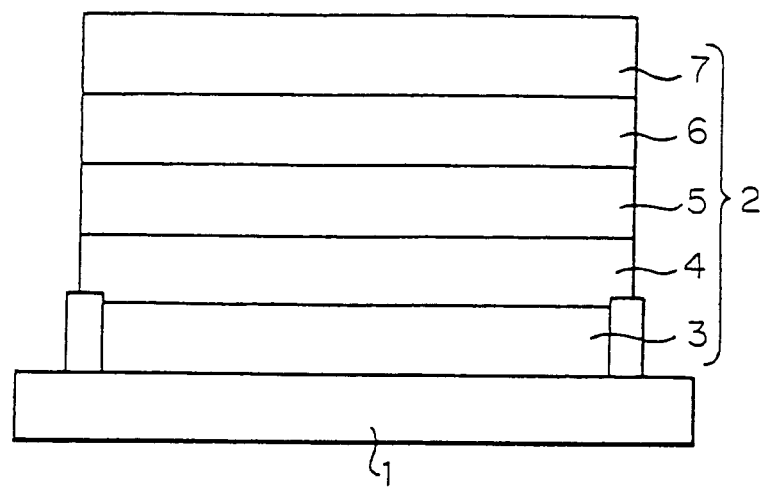
FIG. 22 is a sectional view illustrating a configuration of an organic EL element.
Figure 23:
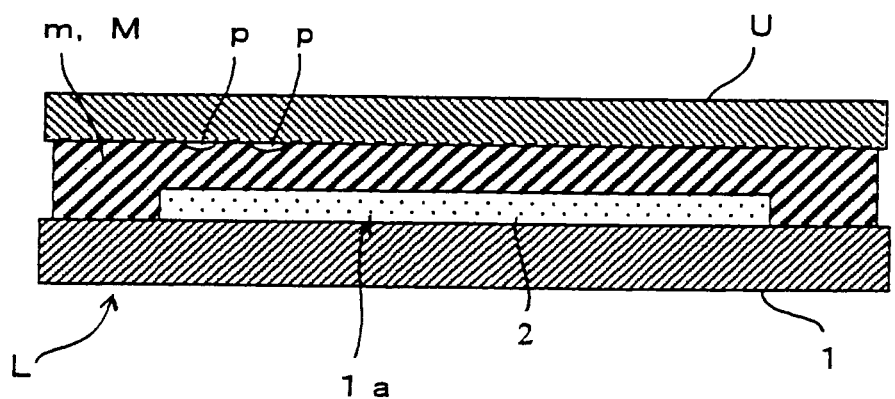
FIG. 23 is a sectional view illustrating an example of a constitution of a conventional display apparatus.

Here, explanations will be made of each embodiment in which the present invention is applied to a display apparatus of a configuration where organic EL elements are provided in a display area as light emitting elements. However, as long as the display apparatus is configured such that two members are adhered with each other and a display area is sealed therebetween, the display apparatus of the present invention is not limited to one using organic EL elements as light emitting elements. For example, the present invention is widely applicable to display apparatuses using self emissive type light emitting elements such as inorganic electroluminescent elements, and further, to liquid crystal display apparatuses and the like. In addition, the same reference numerals and symbols are applied to members that are similar to the elements that were described using FIG. 22 and FIG. 23 in the conventional art.

Figure 1:
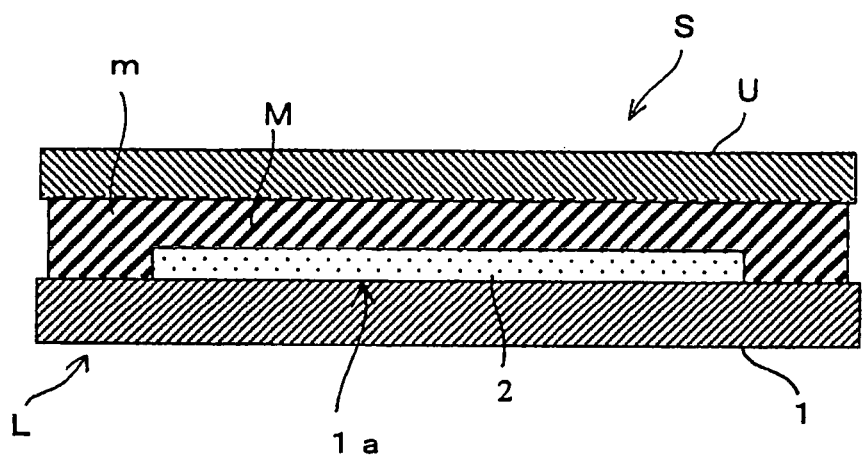
FIG. 1 is a diagram illustrating a configuration of a display apparatus according to an embodiment.

The difference between the display apparatus of the embodiment shown in FIG. 1 and the display apparatus explained in the conventional art lies in the form of adhesion of an element member L, configured by providing a light emitting element 2 on one sheet of a base material 1, and a sealing member U, provided so as to face the element member L in order to seal this light emitting element 2, with a resin layer m in between.

In other words, the resin layer m is one that is formed by combining a resin material M, which is not cured and is dispersed and applied on a plurality of places on an adhesion surface of at least one of the element member L and the sealing member U, by pressing the element member L and the sealing member U against each other with the resin material M in between. In this case, the resin material M is applied in bead-like forms with predetermined intervals, and passages for draining air are formed between the beads. Thus, it is possible to prevent the trapping of air bubbles between the element member L and the sealing member U after adhesion with a relatively simple application of the resin material M. Further, a "bead" refers to the resin material M that is applied in the form of a continuous line, and in the following embodiments, the resin material M that is applied in the form of a line will be referred to as a "bead."

It is preferable that the beads be kept in a domal form, in which when they initially contact another adhesion surface of at least one of the element member L and the sealing member U, they are capable of substantially point-contacting from a sectional view that is substantially orthogonal to the direction in which they extend. Thus, during initial contact immediately after the respective adhesion surface makes contact, the contact areas thereof can be made smaller, it can be made less likely that air will become trapped between the element member L and the sealing member U, and the remaining of the air bubbles mentioned above can be prevented.

Then, by pressing the outer surface of at least one member of the element member L and the sealing member U placed opposite each other with the resin material M in between while shifting the pressed portion in the direction in which the beads extend, it is possible to reliably drain the air remaining between the element member L and the sealing member U from the passages between the beads. Here, it is preferable that at least one of the element member L and the sealing member U adopt a configuration in which one end is made a base end, and a free end, which is the other end, is deflected so that it forms a convex plane on the adhesion surface side, and the member mentioned above is adhered to the other member gradually from the base end towards the free end along with the shifting of the pressed portion. Thus, the draining of air to the outside can be performed with greater reliability. Furthermore, in so doing, by simultaneously adopting a configuration in which the deflection angle is set to gradually decrease along with the shifting of the pressed portion, it is possible to further enhance the effect described above.

In addition, so long as it is a photo-curable resin, the resin material (photo-curable resin) that can be used for the present invention is not particularly limited. For example, a photo-radical polymerization resin, whose main component includes various (meta) acrylates such as polyester (meta) acrylate, polyether (meta) acrylate, epoxy (meta) acrylate, polyurethane (meta) acrylate or the like, a photo-cationic polymerization resin, whose main component is a resin such as epoxy and vinyl ether or the like, and a thiolene-added resin or the like may be considered. Among these photo-curable resins, photo-cationic polymerization resins of the epoxy-resin group are preferable, whose cured substance has a low contraction percentage, whose out-gas is small in quantity, and which are superior in terms of long-term reliability.

As an aspect in applying the photo-curable resin mentioned above, although it varies with the nozzle diameter of the application machine, the amount discharged from the nozzle, the quality of the material of the adhesion surface (the surface tension), the kind of photo-curable resin and the like, it is generally preferable that it have a viscosity of approximately 3,000 to 30,000 cp. In addition, if an organic EL panel or a liquid crystal display panel is presupposed as the element member, as the properties after the photo-curable resin is cured, it is desirable that the transparency of light (in the visible light range) be high and that it be transparent and colorless. Specifically, in the case of a film thickness of 50 to 60 μm (as the cured substance of the photocurable resin), an optical transmittance of 70% or above (preferably, 80% or above) is preferable.

Further, since the cured substance of the photo-curable resin is filled between the element member and the sealing member and is formed so as to reinforce each other, there is a need for it to sufficiently adhere with each member, while at the same time it is preferable that it have flexibility (rubber elasticity) so as to absorb deformation due to external stress. Specifically, it is desirable that the hardness measured by a durometer (a hardness tester) type A based on JIS-K2715 be 30 to 60.

Then, particularly, it is assumed that, of the base material 1 configuring the element member L and the sealing member U, the one disposed on the side from which the emission light of the light emitting element 2 is drawn is configured with, for example, a glass material or other light transmissive materials.

Next, the configuration of an organic EL element used in a display apparatus with such a configuration will be described based on FIG. 2.

If, for example, the display apparatus is of a "transmissive type" in which emission light is drawn from the side of the element member L (the base material 1), the organic EL element (hereinafter, simply referred to as light emitting element) 2 includes a lower electrode 3 formed by sputtering on the base material 1 having light transmittance. This lower electrode 3 is used, for example, as an anode electrode. On this lower electrode 3 are provided sequentially a hole transport layer 4, an emission layer 5 and an electron transport layer 6, and further, an upper electrode 7 as a cathode electrode is provided on this electron transport layer 6, and thus, the light emitting element 2 is configured.

In addition, the lower electrode 3 is not limited to being used as an anode electrode, and it may also be used as a cathode electrode. Similarly, the upper electrode 7 is not limited to being used as a cathode electrode, and if the lower electrode 3 is used as an anode electrode, it is assumed that the upper electrode 7 is used as a cathode electrode. However, in the case of a transmissive type display apparatus, it is assumed that the lower electrode 3 is configured with a light transmissive material.

Then, if the display apparatus is of a "top emitting type" in which the emission light is drawn from the side of the sealing member U, it is assumed that the upper electrode 7 that is used as an anode electrode or a cathode electrode is configured with a transparent material. Also, in this case, the base material 1 is not limited to a transparent material, and a base material on which a thin film transistor (TFT) is formed, may also be used.

Here, for the cathode electrode material that configures the light emitting element 2, in order to effectively inject electrons, it is preferable to use a metal having a small work function from the vacuum level of the electrode material. For example, a metal having a small work function, such as indium (In), magnesium (Mg), silver (Ag), calcium (Ca), barium (Ba), lithium (Li) or the like may be used alone, or as an alloy with other metals to increase stability. On the other hand, for the anode electrode material, in order to effectively inject holes, it is assumed that a material having a large work function from the vacuum level of the electrode material, for example, an alloy of gold (Au), tin oxide ($SnO_2$), and antimony (Sb), an alloy of zinc oxide (ZnO) and aluminum (Al), further, the ITO described above or the like, is used.

In addition, the cathode electrode material and the anode electrode material may include a single material or may include a plurality of layered materials.

Then, it is assumed that, between the lower electrode 3 and the upper electrode 7, at least the emission layer 5 including an organic material is provided, and it is assumed that, as needed, there are appropriately arranged, in the order selected, organic layers, such as a hole transport layer on the side of the anode electrode of the emission layer 5, an electron transport layer and an electron injection layer on the side of the cathode electrode of the emission layer 5. For example, if the lower electrode 3 is configured as an anode electrode, as described above, it is assumed that the hole transport layer 4, the emission layer 5, the electron transport layer 6, and the upper electrode 7 as a cathode electrode are provided sequentially on the lower electrode 3. In addition, there are no limiting conditions for the materials configuring each layer. For example, for the hole transport layer, hole transport materials such as benzidine derivatives, styrylamine derivatives, triphenylmethane derivatives, hidrazone derivatives and the like may be used.

Each of these organic layers may have a layered structure including a plurality of layers, and the emission layer 5 may be a hole transport emission layer or an electron transport emission layer.

Further, with a view to controlling the emission spectrum of the emission layer 5, co-deposition of a small amount of molecules may be performed. For example, each of these organic layers may be an organic thin-film containing a small amount of an organic substance, such as a perylene derivative, a coumarin derivative, a pyrane pigment or the like.

In addition, in such a light-emitting element, it is assumed that an insulation film 8 is provided around the lower electrode 3, and further, that a sealing layer 9 is provided in such a state as to cover these constituent materials. It is assumed that this sealing layer 9 includes, for example, titanium nitride, silicon nitride, an oxide of germanium or the like, that it serves as a protection film for the light emitting element 2, and that it is there to prevent, for example, a resin material (for example, an adhesive or a resin material) or the like from entering the light emitting element 2. Such a sealing layer 9 is formed through, for example, methods such as the CVD method or the sputtering method on the base material 1 in such a state as to cover the light emitting element 2. Further, if this display apparatus is of a top emitting type, it is assumed that this sealing layer 9 is configured with a light transmissive material.

Next, a method of manufacturing the display apparatus with the configuration described above and a specific structure of an adhesion apparatus used for this manufacturing method will be described based on FIG. 1 and FIG. 2 as well as the schematic configuration diagram of the adhesion apparatus of FIG. 3. Further, hereinafter, the terms indicating a position or a direction such as "forward," "backward," "left," "right," "above," "below," "front" and "depth" or the like indicate a position or a direction when FIG. 3 is viewed from the front side unless indicated otherwise.

The adhesion apparatus 10 mentioned above is configured to include a mounting table 11 for mounting the element member L and the sealing member U thereon, application means 12 located above this mounting table 11 and which is for applying the resin material described above partially on an adhesion surface L1 of the element member L on the mounting table 11, adhesion means 13 for adhering the sealing member U on the element member L on which the resin material is applied by the application means 12, and a control panel 14 that is arranged in a space below the mounting table 11 and which controls various operations of the application means 12, the adhesion means 13 or the like. Further, in FIG. 3, reference numeral 15 is an operation display section of the adhesion apparatus 10 that includes a display and various indicators or the like.

The mounting table 11 mentioned above is such that the element member L is provided in the right side area of a top surface 11A, while the sealing member U is provided in a left side area of the same surface. At a plurality of places outside the areas where these element member L and sealing member U are arranged are provided tab portions 11B that can be raised from the top surface 11A by a control dial, whose illustration is omitted, and by the rising of these tab portions 11B, the movement of the element member L and the sealing member U in the direction of the plane within the areas mentioned above where they are arranged may be restricted.

Figure 3:
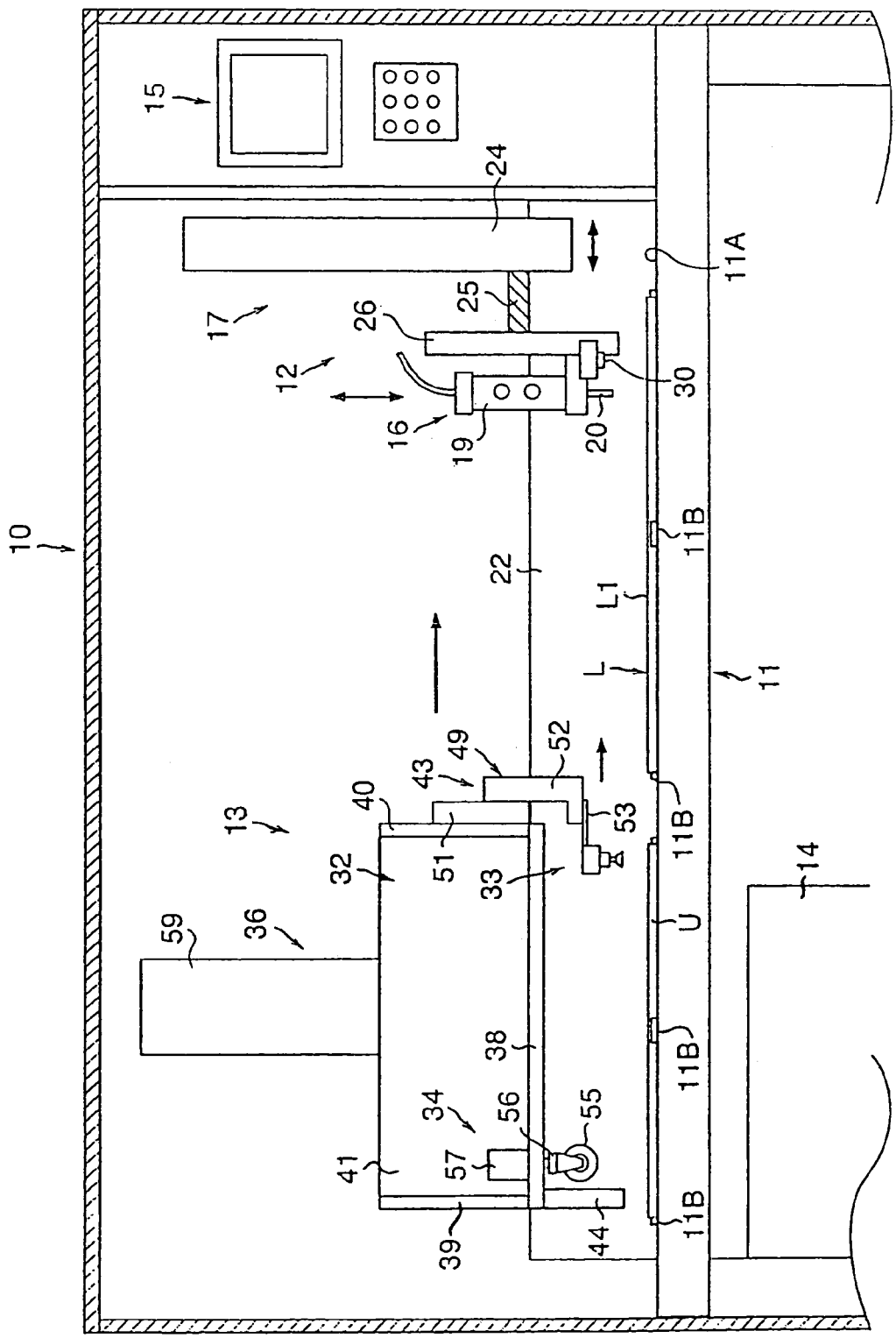
FIG. 3 is a schematic front elevation view of an adhesion apparatus according to an embodiment.
Figure 4:
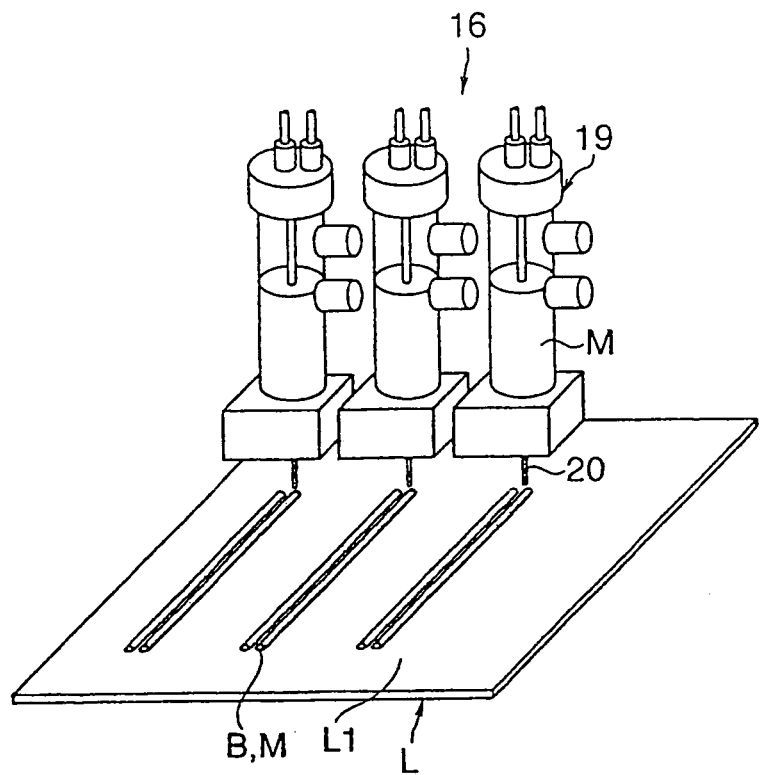
FIG. 4 is a schematic perspective view for explaining the application of a resin material by a syringe apparatus.
Figure 5:
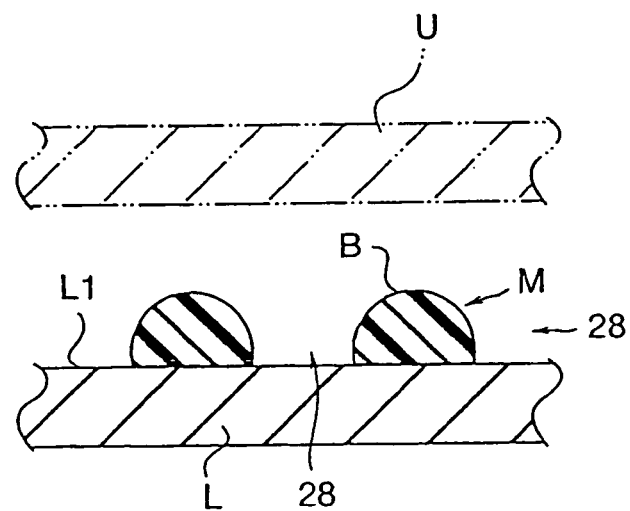
FIG. 5 is an enlarged sectional view of an element member in a state where the resin material is applied.

The application means 12 mentioned above is configured to include a syringe apparatus 16 capable of discharging a resin material and syringe moving means 17 for moving this syringe apparatus 16 along a predetermined path set in advance. The syringe apparatus 16 includes a syringe body 19 provided in such a structure so as to be capable of applying pressure to the resin material M from a tank that is not shown and a nozzle 20 that is provided on the tip side of this syringe body 19 and is capable of discharging the resin material inside the syringe body 19 in beads. In the present embodiment, three syringe apparatuses 16 are provided in FIG. 3 in a direction orthogonal to the page, and as shown in FIG. 4, along with the movement of the syringe apparatuses 16, it is made possible to form three beads B of the resin material M simultaneously. As shown in FIG. 5, while the viscosity of the resin material M is set such that the shape of the cross section of the beads B before the sealing member U is adhered is kept in a shape that substantially follows the outer shape of a dome, the viscosity is also set such that no fluid accumulation occurs in the beads B. In this case, the curvature of the upper portion of the beads B mentioned above is set so that the beads B can point-contact, from a sectional view that is substantially orthogonal to the direction in which they extend, the sealing member U upon initial contact.

As shown in FIG. 3, the syringe moving means 17 has a structure in which the syringe apparatuses 16 are provided so as to be movable in orthogonal triaxial directions by a predetermined drive apparatus. In other words, the syringe moving means 17 is configured to include an X-axis direction moving body 24 movable in the left-right direction along a guide 22 that extends in the left-right direction on the depth side, a rail 25 that is fixed to this X-axis direction moving body 24 and extends in a direction orthogonal to the page in FIG. 2, and a Y-axis direction moving body 26 that is supported with respect to this rail 25 so as to be relatively movable in the direction it extends and that supports the syringe apparatuses 16 such that they are relatively movable in the up-down direction. The syringe moving means 17 can move the syringe apparatuses 16 so that a plurality of beads B are formed on the adhesion surface L1 of the element member L provided on the mounting table 11 and in the form of substantially straight lines along the left-right direction at predetermined intervals. In so doing, between the respective beads B, air drain passages 28 (refer to FIG. 5) for draining air to the outside during adhesion of the sealing member U are formed. In addition, on the side of the lower end of the Y-axis direction moving body 26, a UV lamp 30 for curing the resin material M is attached.

The above-mentioned adhesion means 13 is configured to include a substantially box-shaped support body 32, whose front surface and top surface open, holding means 33 that is supported by this support body 32 and is capable of suction holding the sealing member U using the suction of an unillustrated vacuum pump, pressure providing means 34 that is supported by the support body 32 and is capable of moving in the left-right direction while pressing the outer surface of the sealing member U, and support body moving means 36 for moving the support body 32 in the up-down and left-right directions.

The above-mentioned support body 32 is configured to include a bottom portion 38, side portions 39 and 40 provided on both the left and right end sides of this bottom portion 38, and a rear portion 41 located between the depth sides of these side portions 39 and 40.

The above-mentioned holding means 33 is configured to include a variable suction apparatus 43 that is located at the right end side of the bottom portion 38 and suctions the right end side of the upper surface of the sealing member U and a suction block 44 that is fixed to the left end side of the lower surface of the bottom portion 38 and suctions the left end side of the upper surface of the sealing member U.

Figure 6:
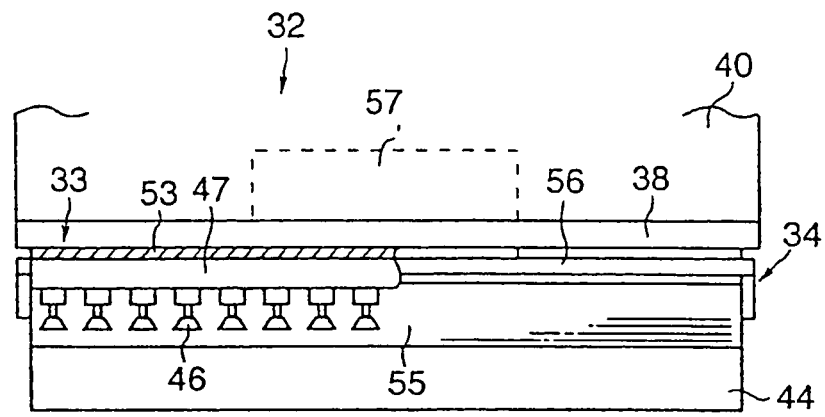
FIG. 6 is a side view of a main portion of the adhesion device.

The above-mentioned variable suction apparatus 43 is configured with suction pads 46 for suctioning the sealing member U, a body portion 47, to which these suction pads 46 are attached, and a biaxial moving mechanism 49 which makes these suction pads 46 and body portion 47 movable relative to the support body 32 in the up-down and left-right directions. Multiple suction pads 46 are provided in a direction orthogonal to the page in FIG. 3 (refer to FIG. 6) and are supported by the body portion 47 so as to be capable of oscillating in the up-down direction. The biaxial moving mechanism 49 is configured to include a fixed block 51 that is fixed to the side portion 40 on the right side, a Z-axis direction moving body 52 that is attached to this fixed block 51 so as to be relatively movable in the up-down direction, and an X-axis direction moving body 53, which is attached to the lower end side of this Z-axis direction moving body 52 so as to be relatively movable in the left-right direction and to which the body portion 47 is fixed. This biaxial moving mechanism 49 is able to move each of moving bodies 52 and 53 in and at a predetermined timing and speed in a predetermined direction by way of the driving of an unillustrated drive apparatus, and thus, the suction pads 46 and the body portion 47 become capable of moving in the up-down and left-right directions with respect to the support body 32. Here, the suction pads 46 are provided such that the suction surfaces at the lower end thereof are capable of rising to a position that is higher than the suction surface at the lower end of the suction block 44, and thus, it is made possible to deflect a free end side, which is the right end area of the sealing member U suctioned by the suction pads 46, in the upper direction with the left end side area of the sealing member U suctioned by the suction block 44 as a base end side. In so doing, the angle of deflection is displaced in accordance with the ascent and descent of the suction pads 46.

Figure 2:
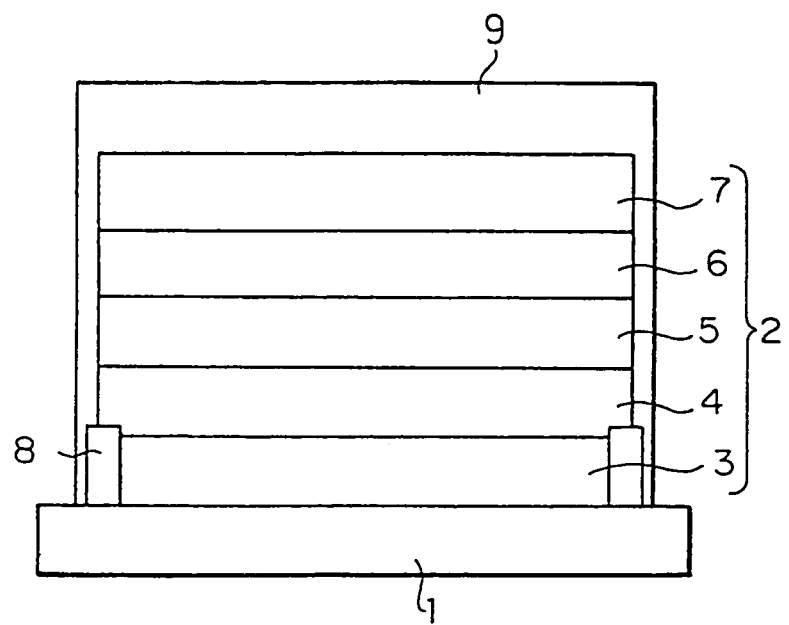
FIG. 2 is a diagram illustrating one configuration example of an organic EL element used in the display apparatus of an embodiment.

The above-mentioned pressure providing means 34 is configured to include a sealing roller 55 that is located between the above-mentioned variable suction apparatus 43 and the above-mentioned suction block 44 and that extends in a direction orthogonal to the page in FIG. 2, a roller support member 56 for supporting this sealing roller 55 rotatably, and a cylinder 57 for raising and lowering the roller support member 56 and sealing roller 55. The sealing roller 55 is provided so as to be capable of contacting the sealing roller 55 with the upper surface of the sealing member U from a state in which the sealing roller 55 stands by above the sealing member U that is held by the suction block 44 and the suction pads 46 by suction. In addition, the sealing roller 55 is provided so as to be capable of applying a predetermined pressure to the sealing member U from above in the process of adhering the sealing member U with the element member L. In addition, the sealing roller 55 is provided so as to be movable together with the cylinder 57 in the left-right direction along the bottom portion 38 of the support body 32, and thus, the pressed position of the sealing member U can be displaced in the left-right direction.

The above-mentioned support body moving means 36 has a structure that enables the support body 32, the holding means 33 and the pressure providing means 34 to move simultaneously in the up-down or the left-right direction in a predetermined timing by the unillustrated drive apparatus, and in the present embodiment, a structure in which the support body 32 is attached to an X-axis direction moving body 59, which is movable in the left-right direction along the above-mentioned guide 22, so as to be relatively movable in the up-down direction is adopted.

Next, a method according to the present embodiment for adhering the sealing member U with the element member L, in which the light emitting element 2 is formed using the adhesion apparatus 10, will be described using FIG. 3 and FIG. 7 through FIG. 16 or the like.

First, as shown in FIG. 2, while the side of the display area 1a, in which the light emitting element 2 is formed, is taken to be the adhesion surface L1, and the element member L is provided in the right side area on the top surface 11 of the mounting table 11 with this adhesion surface L1 facing up, the sealing member U is provided in the left side area thereof, and the movement of the element member L and the sealing member U in the direction of the plane is restricted by raising the tab portions 11b. Then, the application of the resin material M by the application means 12 is started. In other words, by moving the syringe apparatuses 16 by the syringe moving means 17, the tip end side of the nozzles 20 is made to face one end side in the left-right direction of the adhesion surface L1, the discharging of the resin material M is started, and then, by a back-and-forth motion of the syringe apparatuses 16 in the left-right direction, multiple substantially straight line-formed beads B extending in the same direction (refer to FIG. 4) are formed on the adhesion surface L1 at predetermined intervals. In so doing, it is possible to arbitrarily set the application amount of the resin material M, the length of and the pitch between the beads B or the like, and thus, the thickness or the like of the resin layer after the element member L and the sealing member U have been adhered can be controlled arbitrarily. After the application of the resin material M is finished, the entire application means 12 moves to the depth side of the apparatus, and a space, in which the adhesion means 13 can be positioned, is created.

Figure 7:
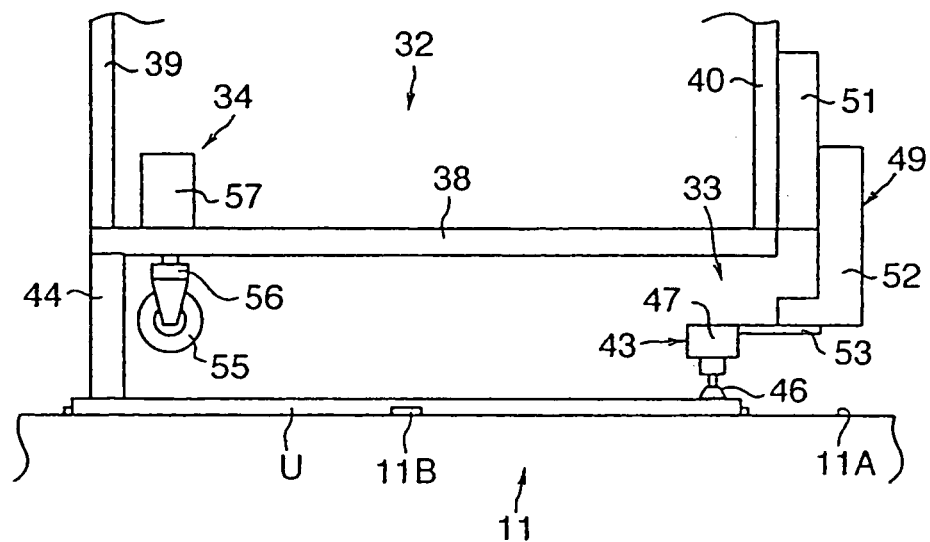
FIG. 7 is an enlarged front elevation view of the main portion of the adhesion apparatus illustrating a state in which a sealing member is suctioned by the adhesion apparatus.
Figure 8:
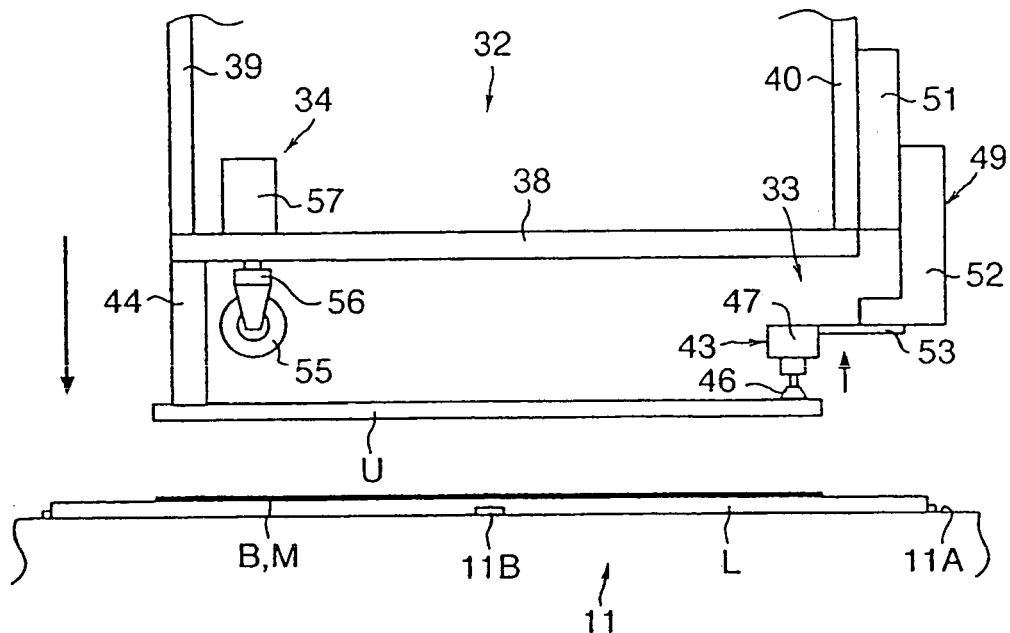
FIG. 8 is an enlarged front elevation view of the main portion of the adhesion apparatus illustrating a state in which the sealing member suctioned by the adhesion apparatus is brought closer to the element member.
Figure 9:
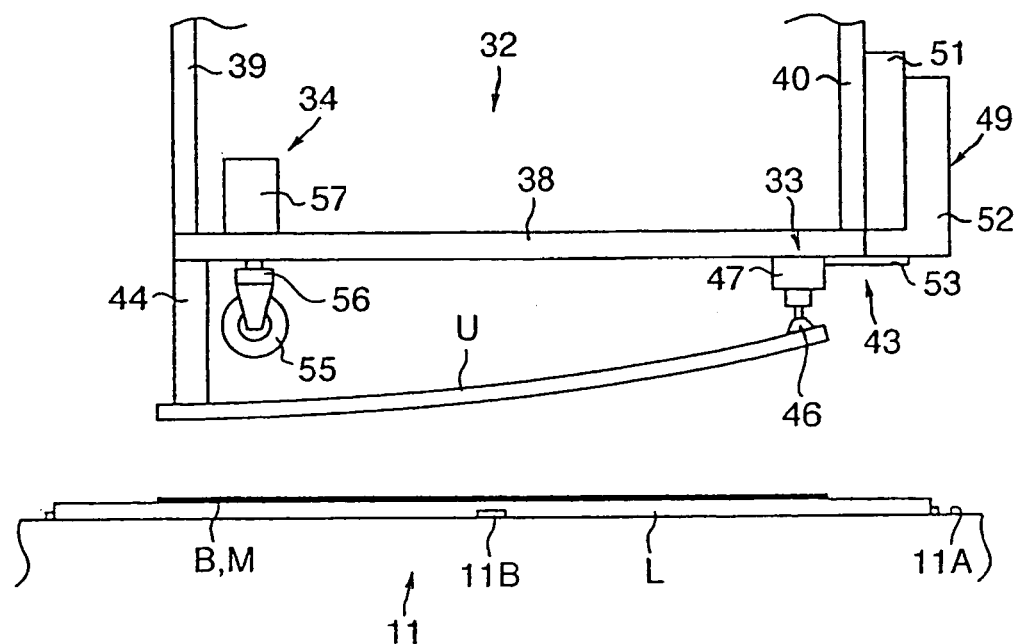
FIG. 9 is an enlarged front elevation view of the main portion of the adhesion apparatus illustrating a state in which the sealing member is made to deflect by the adhesion apparatus.
Figure 10:
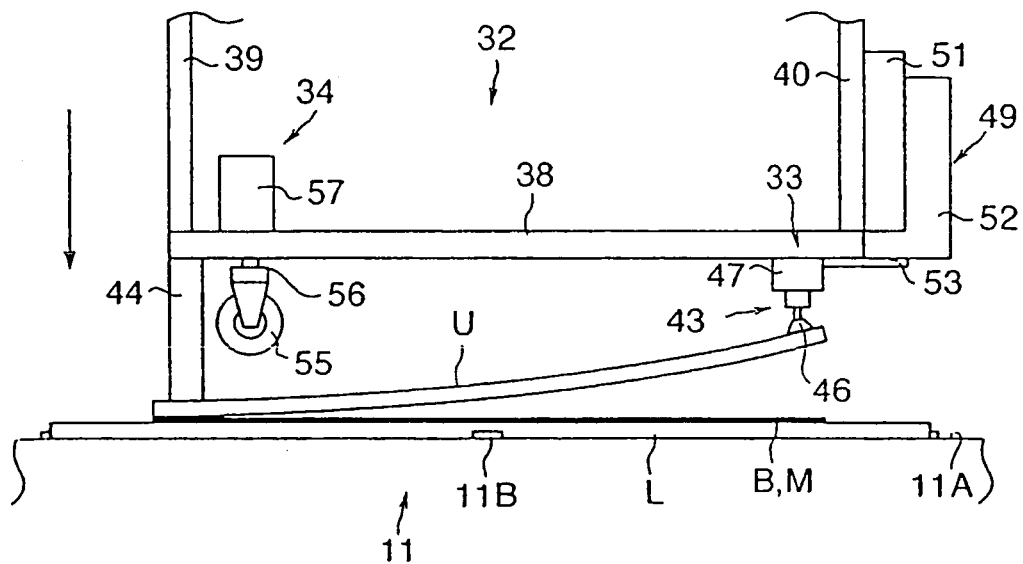
FIG. 10 is an enlarged front elevation view of the main portion of the adhesion apparatus illustrating a state in which a portion of the sealing member is partially contacted with the element member.
Figure 11:
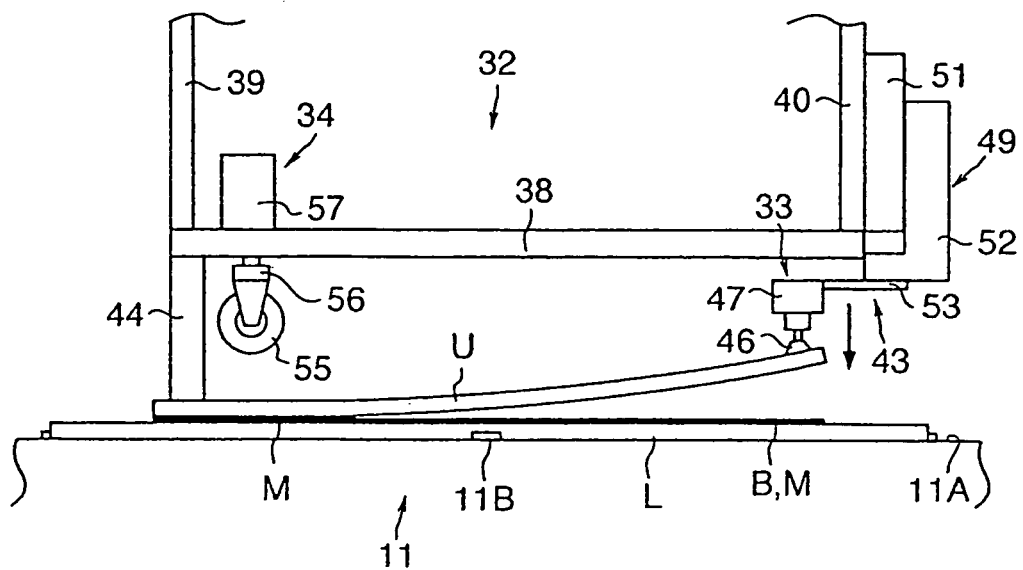
FIG. 11 is an enlarged front elevation view of the main portion of the adhesion apparatus illustrating a state in which the area where the sealing member contacts the element member is made larger.

Subsequently, the adhesion of the sealing member U by the adhesion means 13 is performed. First, the support body 32 descends from the state shown in FIG. 3, and as shown in FIG. 7, the sealing member U located below the support body 32 is suctioned by the suction block 44 and the suction pads 46. Due to the ascent of the entire support body 32 from this state, the sealing member U is raised towards above the mounting table 11, and the support body 32 then moves directly in the right direction to reach, as shown in FIG. 8, a position above the resin material M applied on the element member L. At the same time or thereabout, as shown in FIG. 9, the suction pads 46 ascend with respect to the suction block 44 in a state in which the suction pads 46 suction the sealing member U, and thus, the left end side area of the sealing member U on the side of the suction block 44 becomes the base end side, and the sealing member U is held while the free end side on the side of the suction pads 46 is deflected upwards. From this state, as shown in FIG. 10, the support body 32 descends further to bring the left end side area of the sealing member U first into contact with the resin material M. In so doing, as shown in FIG. 11, the suction pads 46 descend slightly with respect to the suction block 44, and thus, the contact area between the sealing member U and the resin material M expands slightly to the right side and the resin material M located below the sealing roller 55 is compressed.

Figure 12:
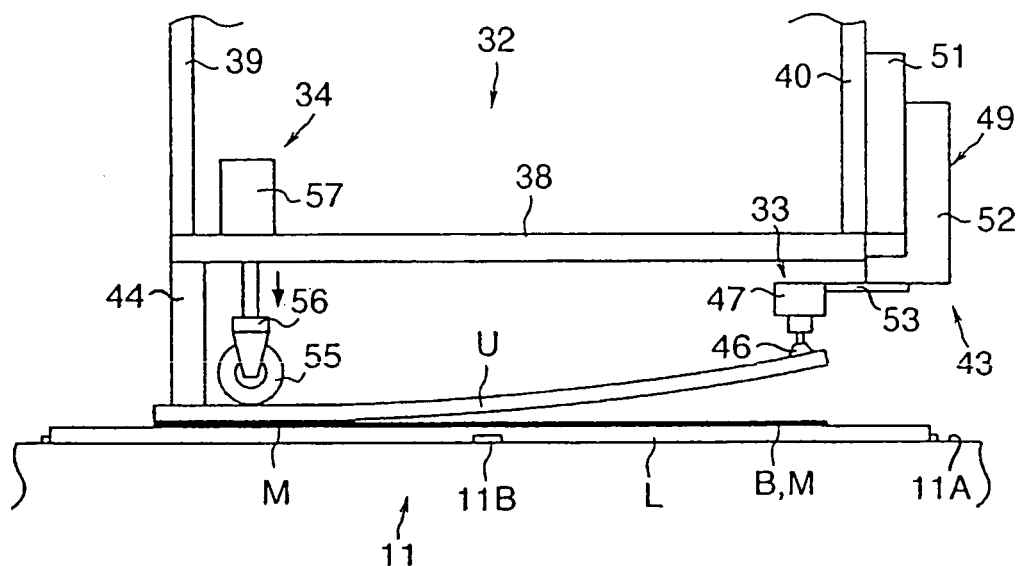
FIG. 12 is an enlarged front elevation view of the main portion of the adhesion device illustrating a state in which the outer side of the sealing member is pressed with a sealing roller.
Figure 13:
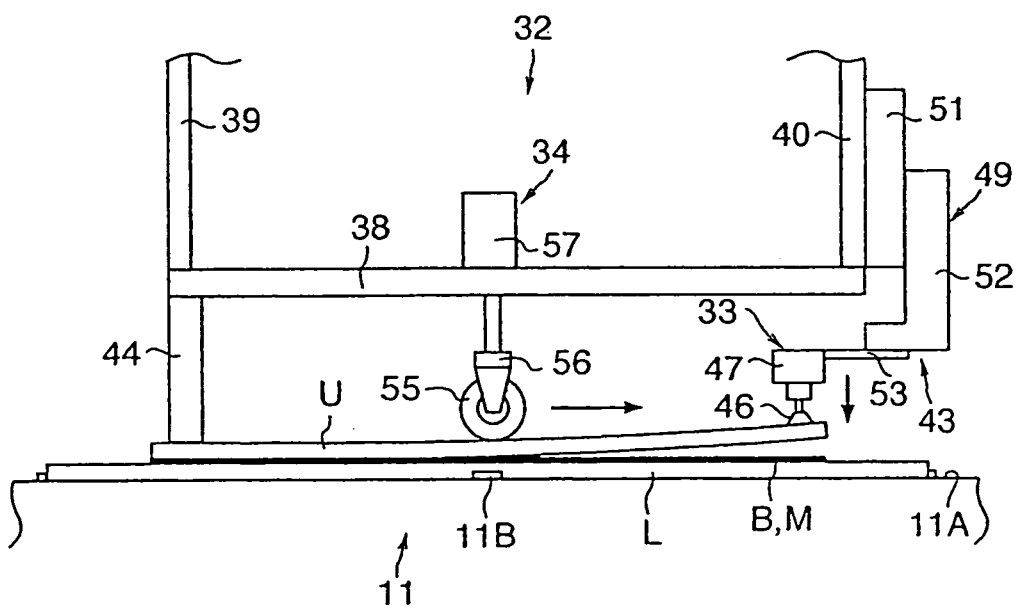
FIG. 13 is an enlarged front elevation view of the main portion of the adhesion apparatus illustrating a state in which the sealing roller moves while pressing.

Thereafter, as shown in FIG. 12, in a state where the sealing roller 55 is located in close proximity to the suction block 44, the cylinder 57 operates, and, while descending, the sealing roller 55 contacts the upper surface of the sealing member U while it is held by the suction block 44 and the suction pads 46 and provides a predetermined pressure to the left end side area of the sealing member U. Then, as shown in FIG. 13, while pressing the sealing member U against the element member L by means of the sealing roller 38, the pressed area is gradually moved to the right side, and the sealing member U is gradually adhered from the left side to the right side. In so doing, with the movement of the sealing roller 38, the suction pads 46 descend with respect to the suction block 44 and the sealing member U is gradually adhered while the angle of deflection is gradually decreased.

Figure 14:
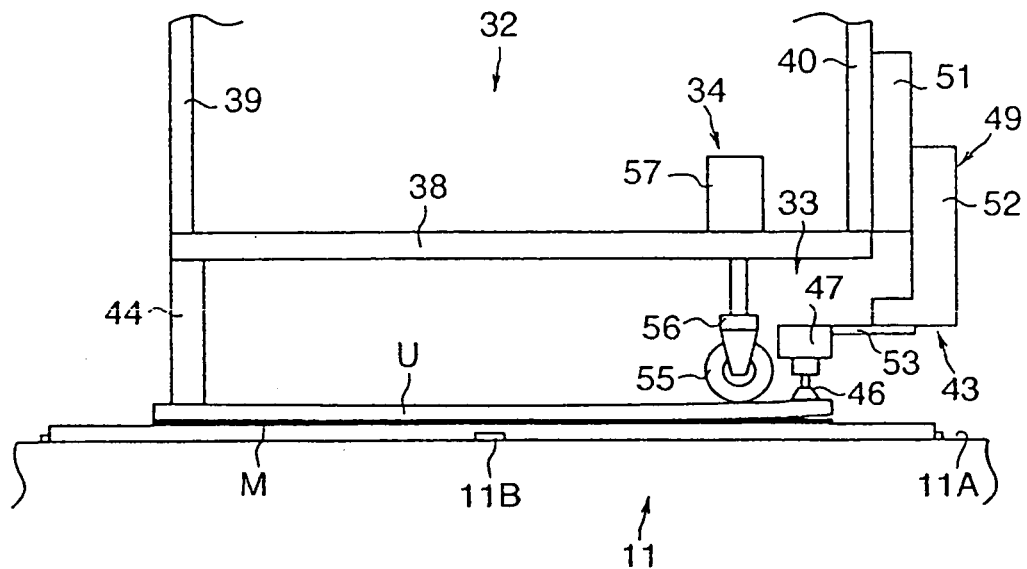
FIG. 14 is an enlarged front elevation view of the main portion of the adhesion apparatus illustrating a state in which the sealing roller has moved to the side of a suction pad.
Figure 15:
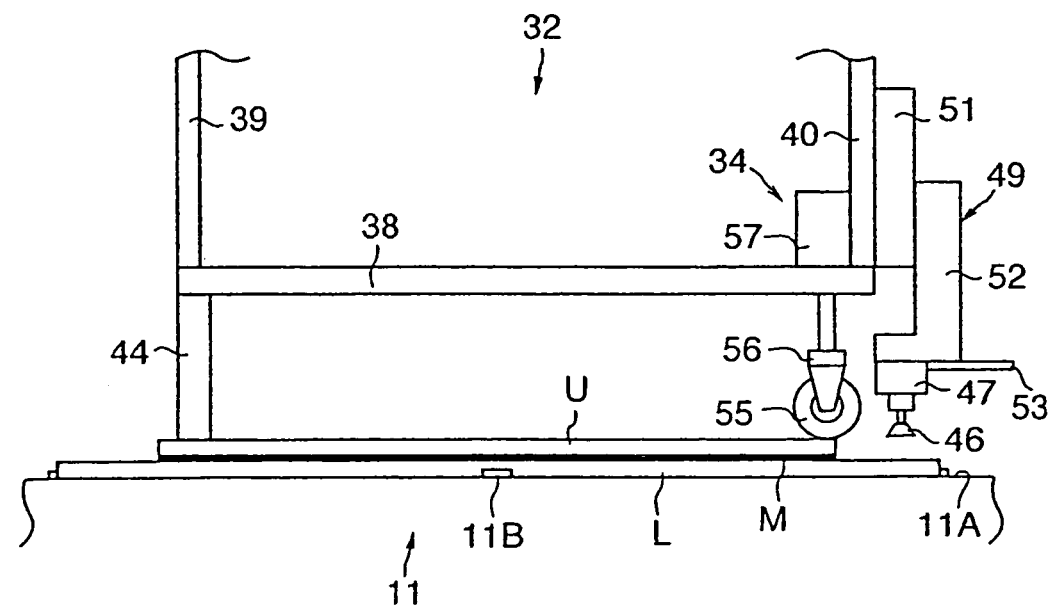
FIG. 15 is an enlarged front elevation view of the main portion of the adhesion apparatus illustrating a state in which the sealing roller has moved to an end portion of the sealing member.
Figure 16:
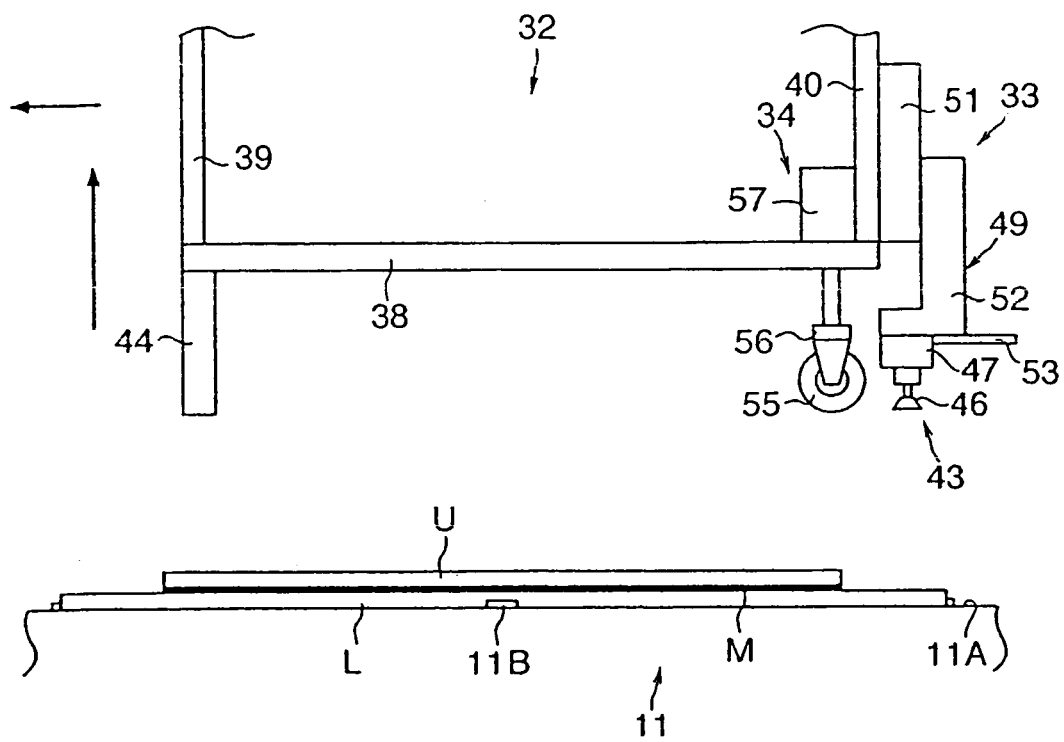
FIG. 16 is an enlarged front elevation view of the main portion of the adhesion apparatus illustrating a state in which the adhesion of the sealing member is completed and adhesion means is rising.

Then, as shown in FIG. 14, when the sealing roller 55 reaches the right end side position of the sealing member U, the suction of the suction pads 46 to the sealing member U is released, and as shown in FIG. 15, the suction pads 46 and the body portion 47 move to the right side with respect to the sealing roller 55 so as to clear the suction pads 47 and the body portion 46 to the outside of the sealing member U. Then, the sealing roller 55 is further moved to the right end of the sealing member U, and the adhesion of the sealing member U is finished. Then, the suction of the suction block 44 to the sealing member U is also released, the entire support body 32, as shown in FIG. 16, moves in the left direction while ascending, and then, stands ready at the initial position shown in FIG. 2. In addition, a UV light is irradiated to the sealing member U, whose adhesion is finished, from the outer side by means of the UV lamp 30 of the application means 12, and curing of the resin material M is performed.

Figure 17A:
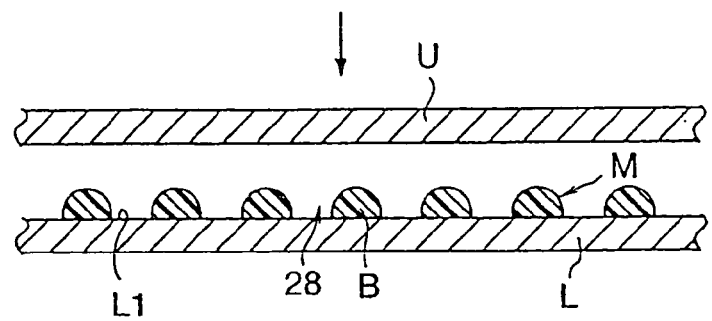
FIG. 17A through FIG. 17D are main portion sectional views in a direction orthogonal to the direction in which beads B extend illustrating a procedure in which the sealing member is adhered to the element member.
Figure 17B:
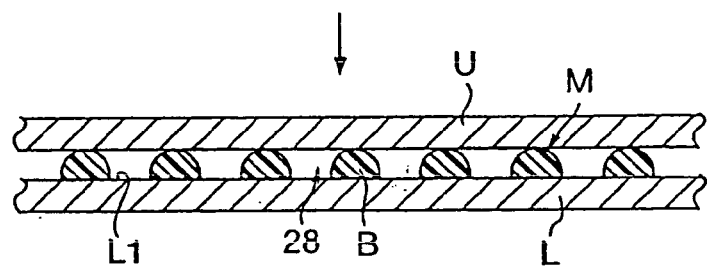
Figure 17C:
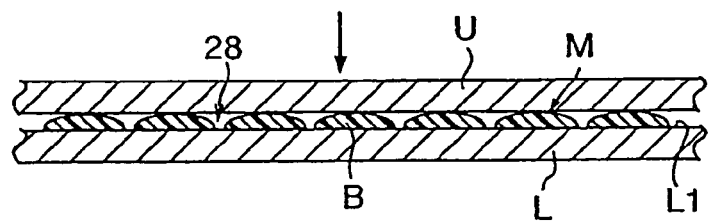
Figure 17D:
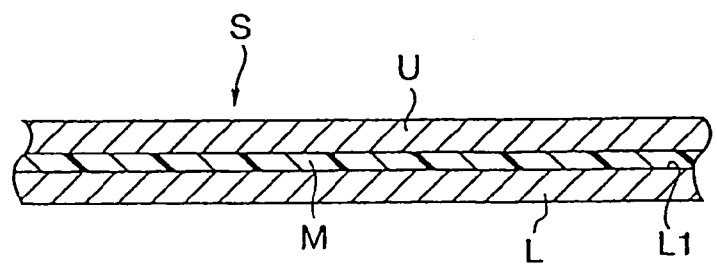

Therefore, according to such an embodiment, the resin material M is applied in a plurality of places on the element member L so that, as shown in FIG. 17A, the beads B are formed at predetermined intervals, while the beads B are provided, as shown in FIG. 17B, in a domal shape such that they are capable of substantially point-contacting upon initial contact when the sealing member U first contacts the element member L. Therefore, the contact area between the resin material M and the sealing member U becomes smaller, and it can be made less likely that air will become trapped therebetween. In addition, since the air drain passages 28 are formed between the respective beads B, and further, since it is moved by means of the pressure providing means 34 while pressing the sealing member U in the direction the air drain passages 28 extend, when a predetermined adhesive force is provided between the element member L and the sealing member U by means of the pressure providing means 34, as shown in FIG. 17C, each bead B is compressed and deformed into a flattened shape by this adhesive force, and the air is drained from the air drain passages 28 to the outside. Then, as shown in FIG. 17D, between the sealing member U and the element member L is formed a thin film layer of the resin layer M in which the respective beads B are combined so as to connect, in other words a resin layer m, is formed. Thus, an effect may be obtained where the sealing member U can be adhered without leaving any air bubbles between the sealing member U and the element member L.

In addition, since no air bubbles remain between the display area 1a and the sealing member U in a display apparatus thus obtained, precise adhesion can be performed. In particular, in the display apparatus S of "a top emitting type" in which the emission light of the light emitting element 2 is drawn from the side of the sealing member U as in the present embodiment, it is possible to prevent the occurrence of non-light emitting points due to the existence of air bubbles within, and good display characteristics can be obtained, while at the same time it becomes possible to protect the display area 1a.

Further, although in the present embodiment, the sealing member U is adhered to the element member L after the resin material M is applied to the element member L, conversely, the element member L may be adhered after the resin material M is applied to the sealing member U.

In addition, the base material 1 configuring the element member L and the sealing member U adhered opposite thereto are not limited to materials made with a glass material, and it is also possible to apply other members such as a resin plate or the like so long as it does not influence aspects of the light emitting element 2.

Further, the beads B are not limited to the cross-sectional form of the present embodiment, and as long as the trapping of air can be prevented upon the initial contact mentioned above, various cross-sectional forms may be adopted. However, the greater the curvature or the oblateness of the upper portion of the cross-sectional form, the smaller the contact area upon the above-mentioned initial contact can be made, and it becomes more advantageous in preventing the entrapment of air thereupon.

In addition, in the present embodiment, the resin material M is applied in a plurality of places in the form of substantially straight lines, however, the present invention is not limited thereto, and as long as air drain passages can be formed, it is also possible to apply the resin material M in a plurality of places of the element member L in other forms such as a wave line form, in spots or a broken line form or the like by way of screen printing.

Further, although in the present embodiment, the manufacturing of the display apparatus S that uses an organic EL element as the light emitting element 2 is given as an example, the present invention is not limited thereto and it can be applied to display apparatuses that include various members that are mutually adhered. For example, in manufacturing a liquid display apparatus, when a sealing member is adhered with an element member, on which a drive element or the like is formed, with a resin material in between, it is also possible to use the above-mentioned adhesion apparatus 10 or an adhesion apparatus 100.

In addition, the configuration of each part of the apparatus in the present embodiment is not limited to the illustrated configuration examples, and as long as substantially similar effects are achieved, various modifications are possible.

Next, examples of the present invention will be described.

EXAMPLE 1

First, the light emitting element 2 was formed in the display area 1a on the base material 1 made of a glass plate to obtain the element member L.

In so doing, first, ITO (film-thickness of approximately 100 nm) was formed as a lower electrode that becomes an anode electrode to make a cell for an organic EL element that is masked with an insulation film except for the light emitting area 1a by $SiO_2$ deposition.

Figure 18:
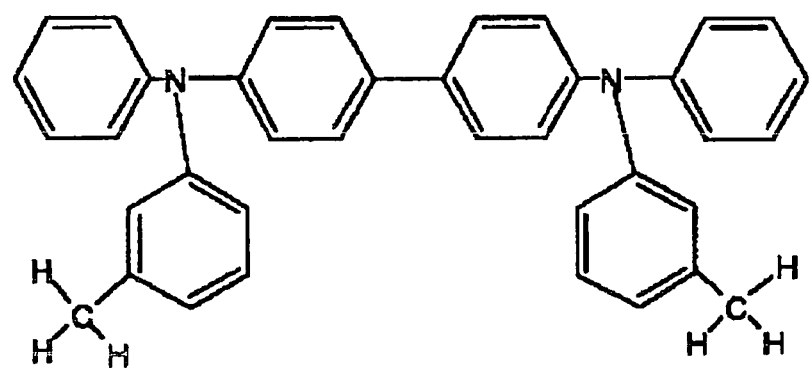
FIG. 18 is a structural formula of TPD used for a hole transport layer in an example.
Figure 19:
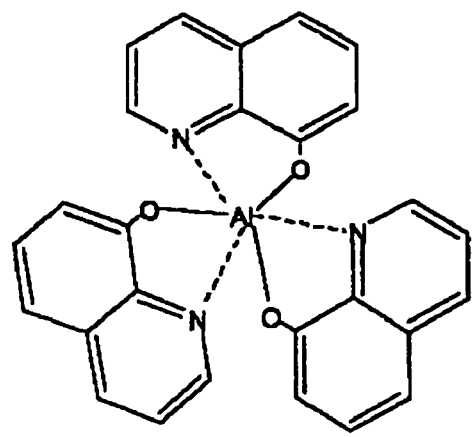
FIG. 19 is a structural formula of $Alq_3$ used for an electron transport emissive layer in an example.

Next, approximately 50 nm of TPD (N,N'-diphenyl-N,N'-di(3-methylphenyl)4,4'-diaminobiphenyl) shown in FIG. 18 was deposited in a vacuum by a vacuum deposition method (a deposition rate of 0.2 to 0.4 nm/sec.). After 50 nm of an aluminum quinoline complex $Alq_3$ (tris(8-quinolinol)aluminum) (refer to FIG. 19), which is a light emitting material having electron transport characteristics, was deposited (deposition rate of 0.2 to 0.4 nm/sec.) as an emission layer, approximately 0.5 nm of Li (lithium) was deposited (deposition rate of up to 0.03 nm/sec.) as a cathode electrode, and 200 nm of AlSiCu (Si-1.0 weight percent, Cu-0.5 weight percent) was deposited as a cathode electrode sealing layer. Further, in order to seal completely, 200 nm of an AuGe electrode was deposited, and then, 3 μm of a silicon nitride film was deposited as a cathode electrode sealing layer to manufacture the light emitting element 2.

When the properties of the organic EL element thus manufactured were measured, the maximum emission light wavelength was 520 nm, the coordinates on the CIE chromaticity diagram were (0.32, 0.54), and good green light emission was exhibited. The luminance at a current density of 100 mA/cm$^2$ was 6400 cd/m$^2$. From the shape of the emission spectrum, it was obvious that it was light emission from $Alq_3$.

The sealing member U was adhered to the element member L that was obtained by forming the light emitting element (the organic EL element) 2 on the base material 1 in the method described above. In so doing, a glass substrate was taken to be the sealing member U, and the element member L and the sealing member U were adhered to each other using the adhesion apparatus of the configuration described with respect to the first embodiment. For the resin material M, a UV curable resin (30Y-332 manufactured by Three Bond Co., Ltd.) was used, and this resin material M was applied in beads. The adhesion operation was performed under an environment with water and oxygen concentrations of 1 ppm or below. In addition, after the element member L and the sealing member U were adhered with each other, a UV ray was immediately irradiated from the side of the sealing member U to cure the resin material M.

When a drive test in which the display apparatus thus manufactured was driven with a constant current of 5 mA/cm$^2$ in an atmosphere of a temperature of 20° C. and a relative humidity of 20% or below (initial luminance of 230 cd/m$^2$) was performed, there were no dark spots that could be observed with the naked eye on the light emitting surface after one hour of driving, and no dark spots could be detected even by an observation through a finder having a magnifying power of 10.

EXAMPLE 2

First, the light emitting element 2 was formed in the display area 1a on the base material 1 made of a glass plate.

In so doing, Cr (film thickness of approximately 200 nm) was formed as a lower electrode that becomes an anode electrode, and a cell for an organic EL element that is masked with an insulation film, except for a light emitting area, by $SiO_2$ deposition was manufactured.

Next, on the anode electrode, approximately 50 nm of TPD was deposited in a vacuum through a vacuum deposition method (deposition rate of 0.2 to 0.4 nm/sec.) as a hole transport layer. On this deposited TPD, 50 nm of $Alq_3$, which is a light emitting material having electron transport characteristics, was deposited (deposition rate of 0.2 to 0.4 nm/sec.) as an emission layer, and then, approximately 0.5 nm of Mg—Ag was deposited (deposition rate of up to 0.03 nm/sec.) as a cathode electrode. Further, 3 μm of a silicon nitride film was deposited as a cathode electrode sealing layer to manufacture the light emitting element 2.

When the properties of the light emitting element 2 thus manufactured were measured, the maximum emission light wavelength was 520 nm, the coordinates on the CIE chromaticity diagram were (0.32, 0.54), and good green light emission was exhibited. The luminance at a current density of 100 mA/cm$^2$ was 4000 cd/m$^2$. From the shape of the emission spectrum, it was obvious that it was light emission from $Alq_3$.

The sealing member U was adhered, as in example 1, to the element member L, which was obtained by forming the light emitting element 2 on the base material 1 in the method described above. The display apparatus that was thus manufactured turned out to be "a top emitting type" display apparatus in which the emission light is drawn from the side of the sealing member U.

When a drive test of the display apparatus thus manufactured was performed under conditions similar to example 1 (initial luminance of 230 cd/m$^2$), there were no dark spots that could be observed with the naked eye on the light emitting surface after one hour of driving, and no dark spots could be detected even by an observation through a finder having a magnifying power of 10. In addition, it was also confirmed that no air bubbles were trapped in the resin layer m.

EXAMPLE 3

First, the light emitting element 2 was formed in the display area 1a on the base material 1 made of a glass plate to obtain the element member L.

In so doing, first, ITO (film thickness of approximately 100 nm) was formed as a lower electrode that becomes an anode electrode, and a cell for an organic EL element that is masked with an insulation film except for the light emitting area 1a through $SiO_2$ deposition was manufactured.

Figure 20:
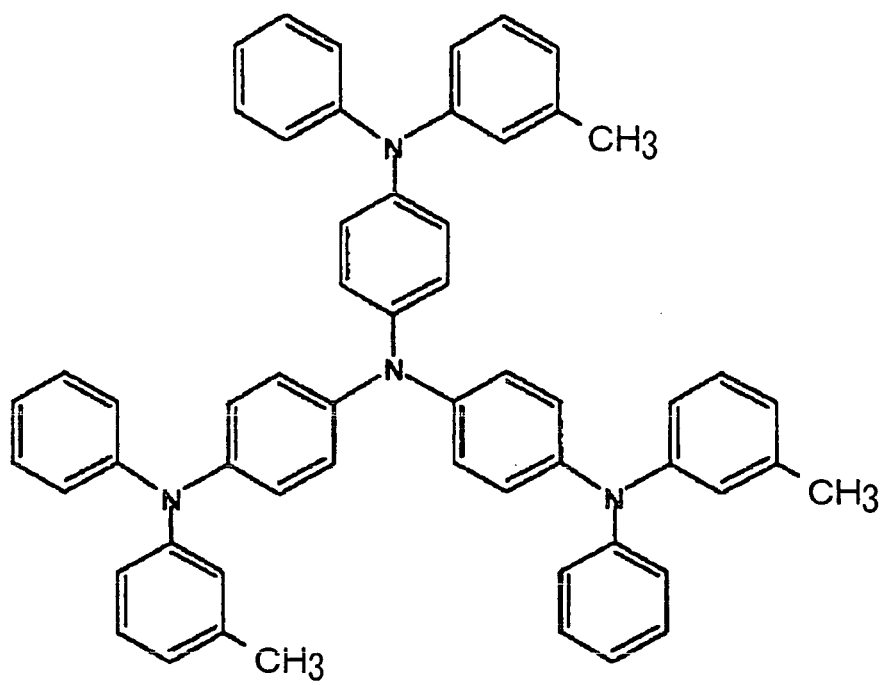
FIG. 20 is a structural formula of m-MTDATA used for a hole injection layer in an example.
Figure 21:
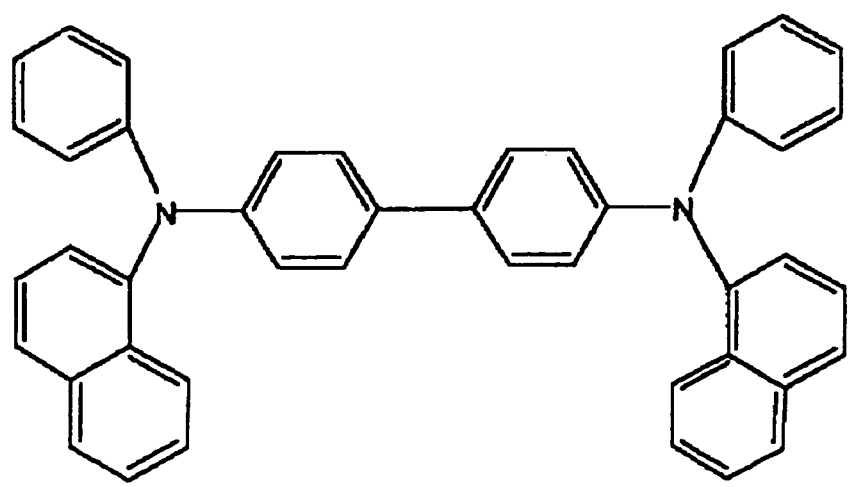
FIG. 21 is a structural formula of $\alpha$-NPD used for a hole transport layer in an example.

Next, on the anode electrode were deposited 30 nm of m-MTDATA (4,4',4"-tris(3-methylphenylphenylamino) triphenylamine) shown in FIG. 20 (deposition rate of 0.2 to 0.4 nm/sec.) in a vacuum through a vacuum deposition method as a hole injection layer, and 30 nm of α-NPD (α-naphtyl phenil diamine) shown in FIG. 21 (deposition rate of 0.2 to 0.4 nm/sec.) in a vacuum by a vacuum deposition method as a hole transport layer, and after 50 nm of $Alq_3$ (8-hydroxy quinorine aluminum) was deposited as an electron transport emissive layer, approximately 0.5 nm of Li was deposited (deposition rate of up to 0.3 nm/sec.) as a cathode electrode, and 200 nm of AlCu (Cu-1 weight percent) was deposited as a cathode electrode sealing layer. Further, in order to seal completely, 200 nm of an AuGe electrode was deposited to manufacture the light emitting element 2.

When the properties of the light emitting element 2 thus manufactured were measured, the maximum emission light wavelength was 520 nm, the coordinates on the CIE chromaticity diagram were (0.32, 0.55), and good green light emission was exhibited. The luminance at a current density of 400 mA/cm$^2$ was 26000 cd/m$^2$. From the shape of the emission spectrum, it was obvious that it was light emission from $Alq_3$.

Next, a display apparatus was manufactured by adhering the sealing member U, as in example 1, to the element member L, which was obtained by forming the light emitting element 2 on the base material 1 in the method described above.

When a drive test of each display apparatus thus manufactured was performed under conditions similar to example 1 (initial luminance of 200 cd/m$^2$), there were no dark spots that could be observed with the naked eye on the light emitting surface after one hour of driving, and no dark spots could be detected even by an observation through a finder having a magnifying power of 10.

EXAMPLE 4

First, the light emitting element 2 was formed in the display area 1a on the base material 1 made of a glass plate.

In so doing, first, Cr (film thickness of approximately 200 nm) was formed as a lower electrode that becomes an anode electrode, and a cell for an organic EL element that is masked with an insulation film, except for the light emitting area, by $SiO_2$ deposition was manufactured.

Next, on the anode electrode were deposited 30 nm of m-MTDATA (4,4',4"-tris(3-methylphenylphenylamino) triphenylamine) (deposition rate of 0.2 to 0.4 nm/sec.) in a vacuum through a vacuum deposition method as a hole injection layer, and 30 nm of α-NPD (α-naphtyl phenil diamine) (deposition rate of 0.2 to 0.4 nm/sec.) in a vacuum by a vacuum deposition method as a hole transport layer, and after 50 nm of $Alq_3$, which is an electron transportive light emitting material, was deposited (deposition rate of 0.2 to 0.4 nm/sec) as an emission layer, approximately 0.5 nm of Mg—Ag was deposited (deposition rate of up to 0.3 nm/sec.) as a cathode electrode. Further, 3 μm of a silicon nitride film was deposited as a cathode electrode sealing layer to manufacture the light emitting element 2.

When the properties of the light emitting element 2 thus manufactured were measured, the maximum emission light wavelength was 520 nm, the coordinates on the CIE chromaticity diagram were (0.32, 0.55), and good green light emission was exhibited. The luminance at a current density of 400 $mA/cm^2$ was 16000 $cd/m^2$. From the shape of the emission spectrum, it was obvious that it was light emission from $Alq_3$.

The sealing member U was adhered, as in embodiment 1, to the element member L, which was obtained by forming the light emitting element 2 on the base material 1 in the method described above. The display apparatus that was thus manufactured turned out to be "a top emitting type" display apparatus in which the emission light is drawn from the side of the sealing member U.

When a drive test of the display apparatus thus manufactured was performed under conditions similar to example 1 (initial luminance of 200 $cd/m^2$), there were no dark spots that could be observed with the naked eye on the light emitting surface after one hour of driving, and no dark spots could be detected even by an observation through a finder having a magnifying power of 10. In addition, it was also confirmed that no air bubbles were trapped in the resin layer m.

As described above, according to the present invention, by adopting, for a display apparatus, a configuration in which a resin material is applied in a plurality of places between the element member, on which a display area is provided, and the sealing member so that air drain passages are formed, and the element member and the sealing member are adhered with each other in a state in which a resin layer is formed such that when an adhesion force along the air drain passages is provided between the element member and the sealing member, air is drained from the above-mentioned air drain passages towards the outside and the partially applied resin material connects, a display apparatus in which no air bubbles remain between the display area of the element member and the sealing member can be obtained. As a result, especially in a display apparatus for drawing display light from the side of the sealing member, occurrences of non-light emitting points resulting from the entrapment of air bubbles are prevented and it becomes possible to obtain good display characteristics.

In addition, by having the resin layer be one in which the resin material applied in the form of a plurality of lines so as to form air drain passages is combined, it becomes a resin layer in which the entrapment of air bubbles between the element member and the display member after adhesion is prevented through a relatively simple application of the resin material.

Further, because the resin material applied in the form of lines is kept, from a cross-sectional view that is substantially orthogonal to the direction in which it extends, in a domal shape capable of substantially point-contacting upon initial contact with another adhesion surface, it is possible to make the contact area thereof smaller, and it can be made a display apparatus in which the entrapment of air therebetween is prevented.

The invention claimed is:

1. A display apparatus comprising:
   a resin layer between an element member and a sealing member, said resin layer being beads adapted to fill a space between said element member and said sealing member,
   wherein said beads are at places on at least one of an external surface of said element member and an adhesion surface of said sealing member,
   wherein one of said beads is located at one of said places, another of said beads being located at another of said places, and
   wherein said beads are continuous lines.

2. The display apparatus according to claim 1, wherein said one of said beads being spaced apart from said another of said beads.

3. The display apparatus according to claim 2, wherein said beads have a domal cross-section.

4. A display apparatus comprising:
   a light emitting element between a element member and resin, beads of said resin being between said element member and a sealing member.

5. The display apparatus according to claim 4, wherein said one of said beads is adapted to contact said another of said beads when pressure is applied to said sealing member.

6. The display apparatus according to claim 4, wherein said element member comprises a light transmissive material.

7. The display apparatus according to claim 4, wherein said element member is a convex plane.

8. The display apparatus according to claim 4, wherein said sealing member comprises a light transmissive material.

9. The display apparatus according to claim 4, wherein said sealing member is a convex plane.

10. The display apparatus according to claim 4, wherein said beads contact said element member and said sealing member.

11. The display apparatus according to claim 4, wherein a base end of said element member contacts said beads, a free end of said element member being separated from said beads.

12. The display apparatus according to claim 4, wherein a base end of said sealing member contacts said beads, a free end of said sealing member being separated from said beads.

13. The display apparatus according to claim 4, wherein an air drain passage separates said one of the beads from said another of the beads.

14. The display apparatus according to claim 4, wherein said beads are linear.

15. The display apparatus according to claim 4, wherein a cross section for each of said beads is domal.

16. The display apparatus according to claim 15, wherein the base of said cross-section contacts said element member and the crown of said cross-section contacts said sealing member.

17. The display apparatus according to claim 4, wherein said resin is a photo-curable resin.

18. The display apparatus according to claim 4, wherein a viscosity of said resin is approximately 3,000 to 30,000 cp.

19. The display apparatus according to claim 4, wherein an optical transmittance of said resin is 70% or above.

20. The display apparatus according to claim 4, wherein said resin is between said light emitting element and said sealing member.

21. The display apparatus according to claim 4, wherein an air drain passage is between one of the beads and another of the beads.

22. The display apparatus according to claim 4, wherein said light emitting element is between said element member and said sealing member.

23. The display apparatus according to claim 4, wherein said light emitting element includes:
- a lower electrode between said element member and a hole transport layer;
- an emission layer between said hole transport layer and an electron transport layer; and
- an upper electrode between said electron transport layer and a sealing layer.

* * * * *